(12) United States Patent
Kang et al.

(10) Patent No.: US 10,655,242 B2
(45) Date of Patent: *May 19, 2020

(54) GROWING APPARATUS AND SINGLE-CRYSTAL INGOT GROWING METHOD USING THE SAME

(71) Applicant: SK SILTRON CO., LTD., Gumi-si, Gyeongsangbuk-do (KR)

(72) Inventors: In Gu Kang, Gumi-si (KR); Do Won Song, Gumi-si (KR); Jung Ha Hwang, Gumi-si (KR)

(73) Assignee: SK SILTRON CO., LTD., Gumi-si, Gyeongsangbuk-Do (KR)

(*) Notice: Subject to any disclaimer, the term of this patent is extended or adjusted under 35 U.S.C. 154(b) by 136 days.

This patent is subject to a terminal disclaimer.

(21) Appl. No.: 16/020,390

(22) Filed: Jun. 27, 2018

(65) Prior Publication Data

US 2019/0017191 A1 Jan. 17, 2019

(30) Foreign Application Priority Data

Jul. 12, 2017 (KR) .................. 10-2017-0088396

(51) Int. Cl.
*C30B 15/06* (2006.01)
*C30B 15/10* (2006.01)
(Continued)

(52) U.S. Cl.
CPC ............ *C30B 15/10* (2013.01); *C30B 15/14* (2013.01); *C30B 15/305* (2013.01); *C30B 29/06* (2013.01); *C30B 30/04* (2013.01)

(58) Field of Classification Search
CPC .......... C30B 15/00; C30B 15/02; C30B 15/06
See application file for complete search history.

(56) References Cited

U.S. PATENT DOCUMENTS 10,435,809 B2 * 10/2019 Song .................. C30B 29/06

FOREIGN PATENT DOCUMENTS

JP 2008-214118 9/2008
KR 10-0830047 5/2008
(Continued)

OTHER PUBLICATIONS

Korean Office Action dated Jun. 19, 2018 issued in Application No. 10-2017-0088396.
(Continued)

*Primary Examiner* — Robert M Kunemund
(74) *Attorney, Agent, or Firm* — KED & Associates, LLP

(57) ABSTRACT

A single-crystal ingot growing method includes setting a location of an MGP (maximum gauss position) of a magnetic field such that the MGP is located above the surface of a melt, setting a difference in intensity of the magnetic field between a center point of the melt and an edge point of the melt based on the set location of the MGP, setting an intensity of the magnetic field that is applied to the melt based on the set difference in intensity of the magnetic field, and growing a single-crystal ingot based on the set location of the MGP and the set intensity of the magnetic field. The magnetic field is a horizontal magnetic field, the MGP is spaced apart from the surface of the melt by a distance ranging from +50 mm to +150 mm, and the difference in intensity of the magnetic field ranges from 420G to 500G.

20 Claims, 12 Drawing Sheets

(51) Int. Cl.
  *C30B 29/06* (2006.01)
  *C30B 30/04* (2006.01)
  *C30B 15/14* (2006.01)
  *C30B 15/30* (2006.01)

(56) References Cited

FOREIGN PATENT DOCUMENTS

| | | |
|---|---|---|
| KR | 10-1304444 | 9/2013 |
| KR | 10-2015-0042473 | 4/2015 |
| KR | 10-2015-0051737 | 5/2015 |
| KR | 10-1674822 | 11/2016 |

OTHER PUBLICATIONS

Korean Notice of Allowance dated Dec. 26, 2018 issued in Application No. 10-2017-0088396.

* cited by examiner

GROWING APPARATUS AND SINGLE-CRYSTAL INGOT GROWING METHOD USING THE SAME

CROSS-REFERENCE TO RELATED APPLICATION

This application claims the benefit of Korean Patent Application No. 10-2017-0088396, filed on Jul. 12, 2017, which is hereby incorporated by reference as if fully set forth herein.

BACKGROUND OF THE INVENTION

Field of the Invention

Embodiments relate to a single-crystal ingot growing apparatus and a single-crystal ingot growing method using the same.

Discussion of the Related Art

With a single crystal growing method using a Czochralski (CZ) method, after polycrystalline silicon is stacked into a quartz crucible and heated and melted by a graphite heating element, a seed crystal is dipped into the resulting silicon melt to cause crystallization at the interface of the silicon melt, and is then pulled while being rotated, thereby completing the growth of a single-crystal silicon ingot. Thereafter, the grown single-crystal silicon ingot is subjected to slicing, etching and polishing so as to be shaped into a wafer.

FIG. 12 illustrates a horizontal magnetic field that is generally applied to a melt in a crucible 10, and FIG. 13 illustrates oxygen concentration in the radial direction of a single-crystal ingot that is grown in the state in which the horizontal magnetic field shown in FIG. 12 is applied thereto. As can be seen from FIGS. 12 and 13, a maximum gauss position (MGP) of the horizontal magnetic field may be located above the surface of the melt.

Referring to FIGS. 12 and 13, in the process of growing a single-crystal ingot having a diameter of 300 mm, a horizontal magnetic field is applied to increase the amount of charge so as to control convection of the melt. At this time, the intensity of the magnetic field applied to the center of the melt and the intensity of the magnetic field applied to the edge of the melt may be different from each other. The introduction of oxygen into the melt toward the single-crystal ingot is influenced by the difference in the intensity of the magnetic field. Thus, the concentration of the oxygen introduced into the center of the melt and the concentration of the oxygen introduced into the edge of the melt may be different from each other. Due to this variation in oxygen concentration, as shown in FIG. 13, the oxygen concentration at the edge (the portion represented by the dotted line in FIG. 13) of the single-crystal ingot that is being grown decreases sharply. That is, variation in oxygen concentration may increase in the radial direction of the single-crystal ingot.

SUMMARY OF THE INVENTION

Embodiments provide a single-crystal ingot growing apparatus capable of reducing variation in oxygen concentration in the radial direction of a single-crystal ingot or a wafer manufactured using the same, and provide a single-crystal ingot growing method using the apparatus.

In one embodiment, a single-crystal ingot growing method includes setting a location of an MGP (maximum gauss position) of a magnetic field such that the MGP is located above the surface of a melt, setting a difference in intensity of the magnetic field between the center point of the melt and the edge point of the melt based on the set location of the MGP, setting an intensity of the magnetic field that is applied to the melt based on the set difference in intensity of the magnetic field, and growing a single-crystal ingot based on the set location of the MGP and the set intensity of the magnetic field, wherein, in order to set a difference between the maximum value of an oxygen concentration and the minimum value of the oxygen concentration at the edge of a wafer manufactured using the grown single-crystal ingot to be less than 0.15 ppma, the magnetic field is a horizontal magnetic field, the MGP is located so as to be spaced apart from the surface of the melt by a distance ranging from +50 mm to +150 mm, and the difference in intensity of the magnetic field ranges from 420G to 500G.

The set location of the MGP and the set intensity of the magnetic field may be maintained constant during a body-growing process of the single-crystal ingot.

The surface of the melt may be a top surface of the melt that is located between the inner surface of a crucible containing the melt therein and the interface between the single-crystal ingot and the melt.

The center point of the melt and the edge point of the melt may correspond to each other, and the center point and the edge point that correspond to each other may be located at the same height based on the center of the bottom surface of the crucible.

The difference in intensity of the magnetic field may be a value that is obtained by subtracting an intensity of the magnetic field at the center point of the melt from an intensity of the magnetic field at the edge point of the melt.

The method may further include changing the set location of the MGP, and adjusting the intensity of the magnetic field that is applied to the melt so that the difference in intensity of the magnetic field falls within a range from 420G to 500G in accordance with the changed location of the MGP.

The set location of the MGP and the set intensity of the magnetic field may be maintained constant during a necking process, a shouldering process, a body-growing process and a tailing process of the single-crystal ingot.

In another embodiment, a single-crystal ingot growing method includes setting a location of an MGP (maximum gauss position) of a magnetic field such that the MGP is located so as to be spaced apart from the surface of a melt by a distance ranging from +50 mm to +150 mm, setting an intensity of the magnetic field that is applied to the melt such that a difference in intensity of the magnetic field between the center point of the melt and the edge point of the melt ranges from 420G to 500G under a condition of the set location of the MGP, and growing a single-crystal ingot based on the set location of the MGP and the set intensity of the magnetic field, wherein, in order to set a difference between the maximum value of an oxygen concentration and the minimum value of the oxygen concentration at the edge of a wafer manufactured using the grown single-crystal ingot to be less than 0.15 ppma, the magnetic field is a horizontal magnetic field, and the intensity of the magnetic field is set by following Equation 1.

$$420 < 0.175 \times (X - 2400) + 0.1 \times (Y - 50) + 422.5 < 500 \qquad \text{[Equation 1]}$$

Here, X may be the intensity of the magnetic field and Y may be the location of the MGP, ranges of X and Y being as follows: $X \geq 2400G$ and $Y \geq 50$ mm.

The set location of the MGP and the set intensity of the magnetic field may be maintained constant during a body-growing process of the single-crystal ingot.

The surface of the melt may be a top surface of the melt that is located between the inner surface of a crucible containing the melt therein and the interface between the single-crystal ingot and the melt.

The center point of the melt and the edge point of the melt may correspond to each other, and the center point and the edge point that correspond to each other may be located at the same height based on the center of the bottom surface of the crucible.

The difference in intensity of the magnetic field may be a value that is obtained by subtracting an intensity of the magnetic field at the center point of the melt from an intensity of the magnetic field at the edge point of the melt.

The method may further include changing the set location of the MGP, and adjusting the intensity of the magnetic field based on the changed location of the MGP and Equation 1.

The set location of the MGP and the set intensity of the magnetic field may be maintained constant during a necking process, a shouldering process, a body-growing process and a tailing process of the single-crystal ingot.

In a further embodiment, a single-crystal ingot growing apparatus includes a crucible for containing a melt therein, a support rotation shaft for supporting and rotating the crucible, a magnetic field generating unit for generating a magnetic field and applying the magnetic field to the melt contained in the crucible, and a controller for controlling the magnetic field generating unit in order to adjust a location of an MGP (maximum gauss position) of the magnetic field and an intensity of the magnetic field, wherein, in order to set a difference between the maximum value of an oxygen concentration and the minimum value of the oxygen concentration at the edge of a wafer manufactured using a single-crystal ingot to be less than 0.15 ppma, while the single-crystal ingot is grown, the controller controls the location of the MGP of the magnetic field such that the MGP is located so as to be spaced apart from the surface of the melt by a distance ranging from +50 mm to +150 mm, and controls the intensity of the magnetic field such that a difference in intensity of the magnetic field between the center point of the melt and the edge point of the melt ranges from 420G to 500G under a condition of the controlled location of the MGP.

The magnetic field may be a horizontal magnetic field, and the intensity of the magnetic field may be set by following Equation 1.

$$420 < 0.175 \times (X-2400) + 0.1 \times (Y-50) + 422.5 < 500 \qquad \text{[Equation 1]}$$

Here, X may be the intensity of the magnetic field and Y may be the location of the MGP, ranges of X and Y being as follows: X≥2400G and Y≥50 mm.

The location of the MGP and the intensity of the magnetic field may be maintained constant during a body-growing process of the single-crystal ingot. The surface of the melt may be a top surface of the melt that is located between the inner surface of the crucible containing the melt therein and the interface between the single-crystal ingot and the melt. The difference in intensity of the magnetic field may be a value that is obtained by subtracting an intensity of the magnetic field at the center point of the melt from an intensity of the magnetic field at the edge point of the melt.

The controller may change the location of the MGP and may adjust the intensity of the magnetic field based on the changed location of the MGP and Equation 1.

BRIEF DESCRIPTION OF THE DRAWINGS

Arrangements and embodiments may be described in detail with reference to the following drawings in which like reference numerals refer to like elements and wherein.

DETAILED DESCRIPTION OF THE INVENTION

Reference will now be made in detail to the preferred embodiments, examples of which are illustrated in the accompanying drawings.

It will be understood that when an element is referred to as being "on" or "under" another element, it can be directly on/under the element, or one or more intervening elements may also be present. When an element is referred to as being "on" or "under", "under the element" as well as "on the element" can be included based on the element.

In addition, relational terms, such as "first," "second," "on/upper part/above" and "under/lower part/below," are used only to distinguish between one subject or element and another subject and element without necessarily requiring or involving any physical or logical relationship or sequence between such subjects or elements. Wherever possible, the same reference numbers will be used throughout the drawings to refer to the same or like parts.

In addition, since terms, such as "including," "comprising," and "having" mean that one or more corresponding components may exist unless a description is specifically made to the contrary, it shall be understood that one or more other components can be included.

Figure 1:
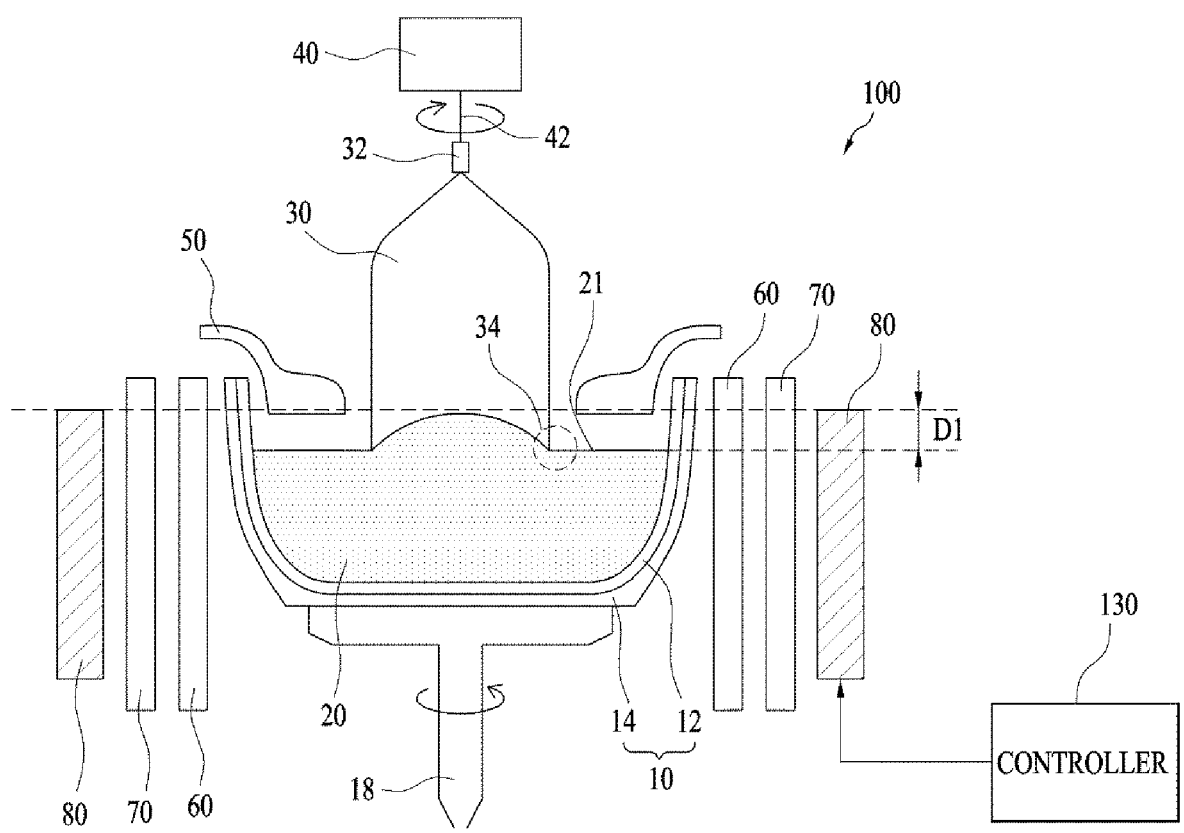
FIG. 1 illustrates a single-crystal ingot growing apparatus according to an embodiment.

FIG. 1 illustrates a single-crystal ingot growing apparatus 100 according to an embodiment.

With reference to FIG. 1, the single-crystal ingot growing apparatus 100 includes a crucible 10, a support rotation shaft 18, a pulling unit 40, a wire 42, a heat-shielding member 50, a heater 60, a heat insulator 70, a magnetic field generating unit 80, and a controller 130. The single-crystal ingot growing apparatus 100 according to the embodiment may be an apparatus that grows a single-crystal ingot 30 using the CZ method. However, the disclosure is not limited thereto.

Although not illustrated in FIG. 1, the single-crystal ingot growing apparatus 100 may further include a space for growing a single-crystal ingot therein, that is, a chamber that accommodates the crucible 10, the crucible support unit 18, the pulling unit 40, the wire 42, the heat-shielding member 50, the heater 60, and the heat insulator 70 therein.

The crucible 10 may be disposed in the chamber, and may contain a raw material for growing the single-crystal ingot 30 therein. The crucible 10 may include an inner crucible 12 formed of quartz and an outer crucible 14 formed of graphite.

The crucible support unit 18 may be located under the crucible 10 to support the crucible 10. The crucible support unit 18 may rotate the crucible 10 in the clockwise direction or in the counterclockwise direction for growth of the single-crystal ingot.

The heater 60 may be disposed in the chamber at a location spaced apart from the outer circumferential surface of the crucible 10, and may heat the crucible 10. The crucible 10 may be heated by heat generated by the heater 60, and thus the temperature of the crucible 10 may rise. With the increase in the temperature of the crucible 10, a polycrystalline raw material (e.g. polycrystalline silicon) accommodated in the crucible 10 may be changed into a melt 20.

The heat-shielding member 50 may block heat radiation to a silicon single crystal that is being grown from the melt 20 in the crucible 10, thereby preventing impurities (e.g. CO gas) generated by the heater 60 from permeating the silicon single crystal that is being grown.

The heat insulator 70 may be located between the inner wall of the chamber and the heater 60 to prevent the heat in the chamber from escaping to the outside of the chamber.

One end of the wire 42 may be connected to a seed chuck (not shown). A seed crystal 32 may be coupled to the seed chuck. The seed crystal 32 may be dipped into the melt 20 within the crucible 10.

The pulling unit 40 may be located at the top of the chamber, and may pull up the wire 42, which is connected to the ingot 30, to the region above the crucible 10 within the chamber.

The magnetic field generating unit 80 may generate a magnetic field, and the magnetic field generated by the magnetic field generating unit 80 may be provided to the melt 20 in the crucible 10 located in the chamber.

For example, the magnetic field generating unit 80 may apply a horizontal magnetic field to the melt 20 in the crucible. The magnetic field generating unit 80 may generate a horizontal magnetic field through, for example, a horizontal magnetic field Czochralski (HMCZ) method.

According to the embodiment, in order to improve the dispersion of oxygen in the radial direction of a wafer manufactured using a single-crystal ingot grown according to the embodiment, the magnetic field generating unit 80 may form a magnetic field such that a maximum gauss position (MGP) is located above the surface of the silicon melt.

The MGP may be located above the surface 21 of the melt 20 so as to be spaced apart from the surface 21 of the melt 20 by a predetermined distance D1. The predetermined distance D1 may range from +50 mm to +150 mm.

When the MGP is located at the surface 21 of the melt 20 or is aligned therewith, the distance D1 may be 0 mm. When the MGP is located above the surface 21 of the melt 20, the distance D1 may have a positive (+) value. Conversely, when the MGP is located below the surface 21 of the melt 20, the distance D1 may have a negative (−) value.

The magnetic field generating unit 80 may generate a magnetic field such that the difference between the intensity of the magnetic field applied to the center point of the melt 20 and the intensity of the magnetic field applied to the edge point of the melt 20 is greater than 420G and less than 500G. Here, G may be a unit of intensity of a magnetic field, i.e. Gauss.

The MGP may be a position where the vertical component of a magnetic field is substantially close to 0 and where the flux density of the magnetic field in the vertical direction is maximized.

For example, the MGP may be a position where the horizontal component of the magnetic field generated by the magnetic field generating unit 80 is maximized.

The magnetic field generating unit 80 may perform a necking process, a shouldering process, a body-growing process and a tailing process on the single-crystal ingot based on the location of the MGP and the intensity of the magnetic field.

The controller 130 may control the magnetic field generating unit 80 in order to adjust the intensity of the magnetic field generated by the magnetic field generating unit 80 and the location of the MGP of the horizontal magnetic field.

For example, the controller 130 may adjust the intensity of the magnetic field that is applied to the melt 20 from the magnetic field generating unit 80, and may control the location of the MGP by moving the location of the magnetic field generating unit 80 vertically.

For example, the controller 130 may control the location of the MGP such that the MGP is located so as to be spaced apart from the surface of the melt by a distance ranging from +50 mm to +150 mm during at least one of the necking process, the shouldering process, the body-growing process or the tailing process, which will be described later.

Further, the controller 130 may adjust the intensity of the magnetic field generated by the magnetic field generating unit 80 such that the difference in intensity of the magnetic field between the center point of the melt and the edge point of the melt ranges from 420G to 500G when the MGP is located at the position set as described above.

For example, the controller 130 may control the magnetic field generating unit 80 so as to determine the intensity of the horizontal magnetic field based on Equation 1, which will be described later.

In order to set the difference between the maximum value of the oxygen concentration and the minimum value of the oxygen concentration at the edge of a wafer manufactured using the single-crystal ingot 30 to be less than 0.15 ppma, while the single-crystal ingot 30 is grown, the controller 130 may control the location of the MGP of the magnetic field such that the MGP is located so as to be spaced apart from the surface of the melt by a distance ranging from +50 mm to +150 mm, and may control the intensity of the magnetic field generated by the magnetic field generating unit 80 such that the difference in intensity of the magnetic field between the center point of the melt and the edge point of the melt ranges from 420G to 500G when the MGP is located at the position set as described above.

A method of growing the single-crystal ingot using the single-crystal ingot growing apparatus according to the embodiment will be described.

Under the process conditions such that the MPG is located at a predetermined position and such that the magnetic field has a predetermined intensity, the necking process of growing a neck, the shouldering process of growing a shoulder, a body-growing process of growing a body, and a tailing process of growing a tail are performed.

Before the necking process, a melting process of introducing a raw material, e.g. silicon, into the crucible and melting the introduced raw material may be performed.

For example, polycrystalline silicon is charged into the crucible 10, and the crucible 10 is heated at a temperature greater than or equal to a melting point (about 1420° C.) of the polycrystalline silicon by the heater 60, thereby forming the melt 20 within the crucible 10.

In the necking process, the seed crystal 32 is brought into contact with the center of the surface of the melt 20 and is then dipped into the melt 20, and the seed crystal 32 is pulled up while the crucible support unit 18 is rotated, thereby forming a neck.

In the necking process, a portion of the silicon melt may be solidified. At this time, as the seed crystal 32 is pulled up, an elongated neck portion having a diameter greater than the diameter of the seed crystal 32 may be continuously formed, which may be referred to as a neck.

After the growth of the neck, the single crystal may be grown such that the diameter thereof gradually increases to a target diameter in the shouldering process. The portion grown in this manner may be referred to as a shoulder.

After the shoulder having a desired target diameter is completely grown, in the body-growing process, the single crystal may be grown in the longitudinal direction so as to have a target length. The portion grown in this manner may be referred to as a body. In the body-growing process, a dopant, e.g. boron, may be added to the single crystal.

After the body is completely grown to have a desired length, in the tailing process, the grown single crystal may be separated from the melt 20 within the crucible 10.

Figure 2:
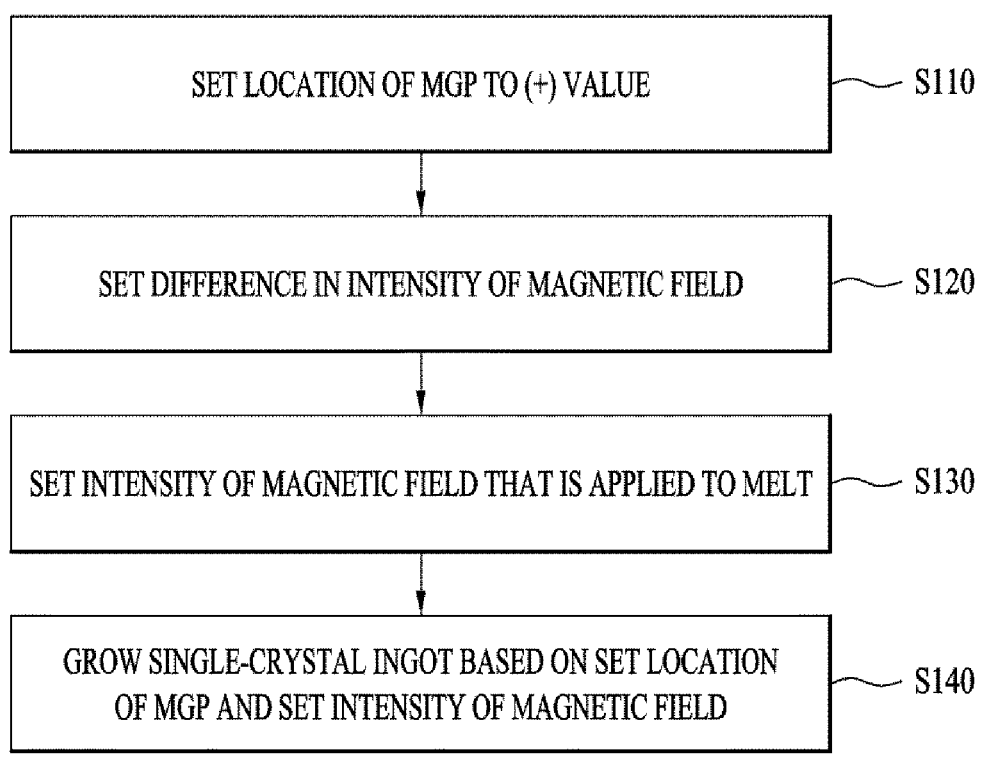
FIG. 2 is a flowchart showing a method of growing a single-crystal ingot according to an embodiment.

FIG. 2 is a flowchart showing the method of growing the single-crystal ingot according to the embodiment.

Hereinafter, the body-growing process of the single-crystal ingot will be described. However, it is to be understood that the body-growing method of the single-crystal ingot, which will be described with reference to FIG. 2, may be identically applied to the necking process, the shouldering process, and/or the tailing process.

Referring to FIG. 2, the location of the MGP of the horizontal magnetic field is set such that the MGP is located above the surface of the melt 20 by a distance having a positive (+) value (S110).

In order to improve the dispersion of oxygen in the radial direction of the wafer manufactured using the single-crystal ingot by reducing the difference in intensity of the magnetic field between the center point of the melt and the edge point of the melt, the body-growing process may be performed in the state in which the MGP of the magnetic field generated by the magnetic field generating unit 80 is located above the surface 21 of the melt 20.

The surface 21 of the melt 20 may be the surface 21 (or the top surface) of the melt 20, which is located between the inner surface of the crucible 10 and an interface 34 between the single-crystal ingot 30 and the melt 20.

In the body-growing process, the MGP may be located above the surface 21 of the melt 20 so as to be spaced apart from the surface 21 of the melt 20 by a predetermined distance D1. The predetermined distance D1 may range from +50 mm to +150 mm.

Subsequently, in order to set the variation in oxygen concentration in the radial direction of the wafer to have a predetermined value, the difference in intensity of the magnetic field between the center point of the melt and the edge point of the melt is set based on the set location of the MGP (S120). Here, the wafer may be a wafer that is manufactured through a slicing process, an etching process and a polishing process using the single-crystal ingot grown according to the embodiment.

For example, the variation in oxygen concentration in the radial direction of the wafer may be the difference between the maximum value of the oxygen concentration and the minimum value of the oxygen concentration at the edge of the wafer. According to the embodiment, in order to improve the dispersion of oxygen concentration in the radial direction of the wafer, the difference between the maximum value of the oxygen concentration and the minimum value of the oxygen concentration at the edge of the wafer manufactured using the single-crystal ingot formed according to the embodiment may be set to be less than 0.15 ppma.

Figure 3A:
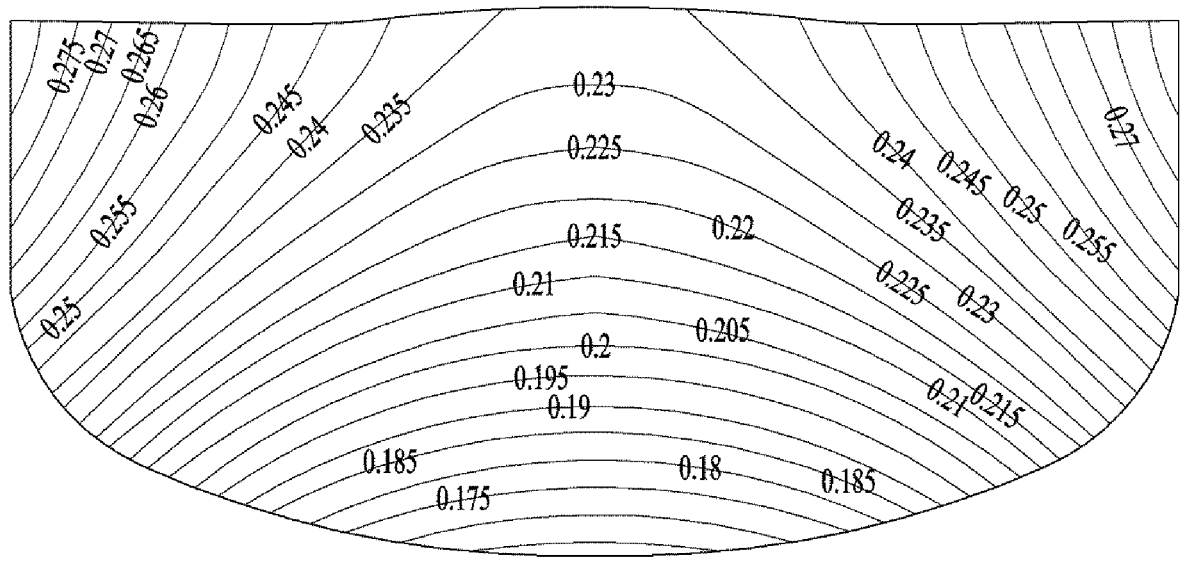
FIG. 3A illustrates a horizontal magnetic field that is applied to a melt in a first direction when an MGP is located at a position corresponding to +50 mm.
Figure 3B:
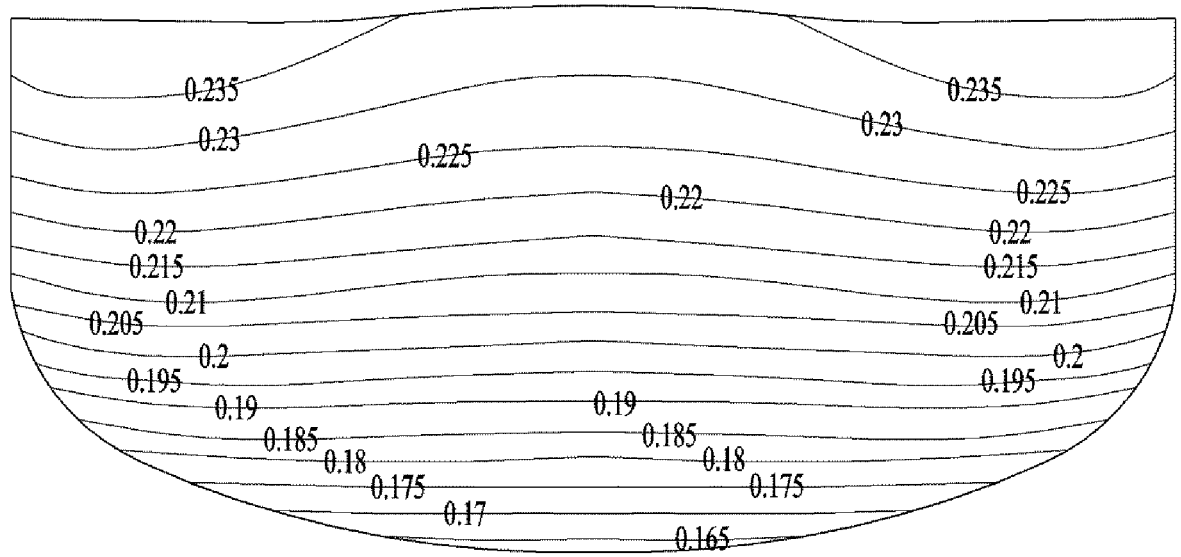
FIG. 3B illustrates a horizontal magnetic field that is applied to the melt in a second direction when the MGP is located at a position corresponding to +50 mm.
Figure 4A:
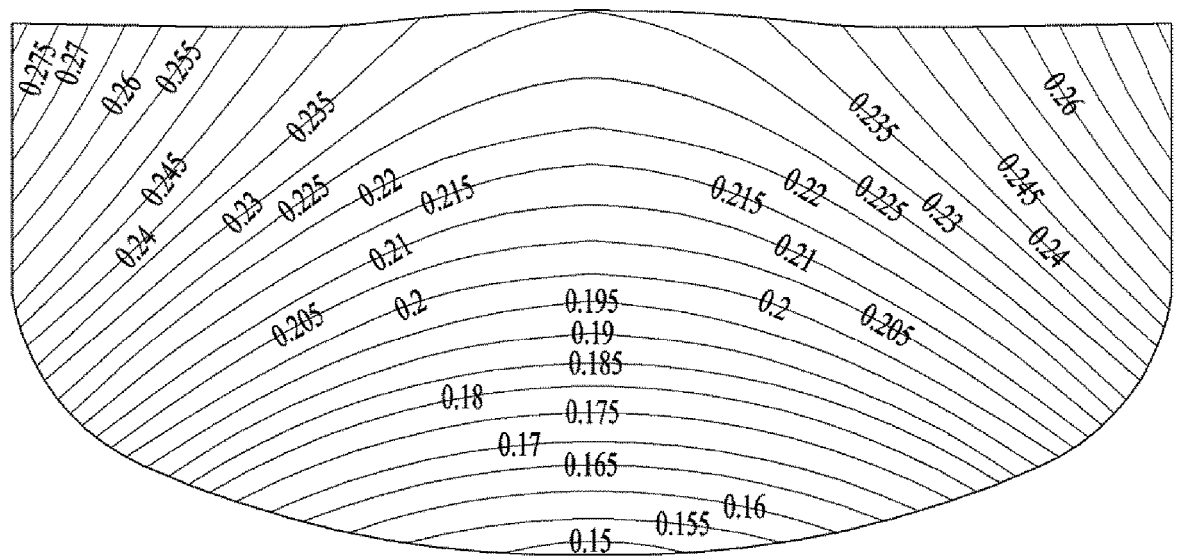
FIG. 4A illustrates a horizontal magnetic field that is applied to the melt in the first direction when the MGP is located at a position corresponding to +100 mm.
Figure 4B:
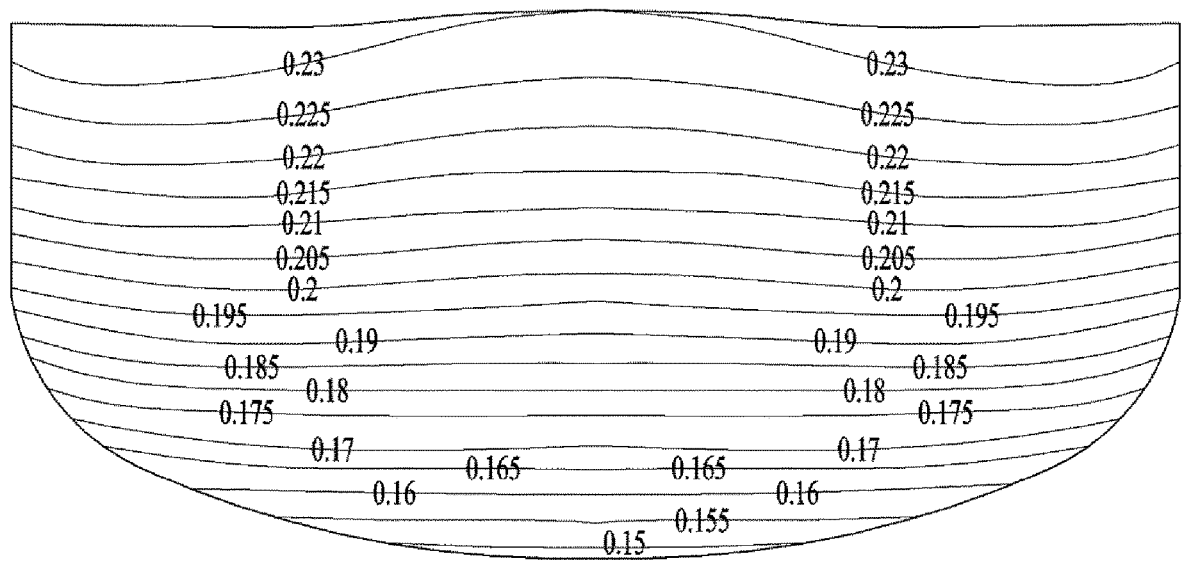
FIG. 4B illustrates a horizontal magnetic field that is applied to the melt in the second direction when the MGP is located at a position corresponding to +100 mm.
Figure 5A:
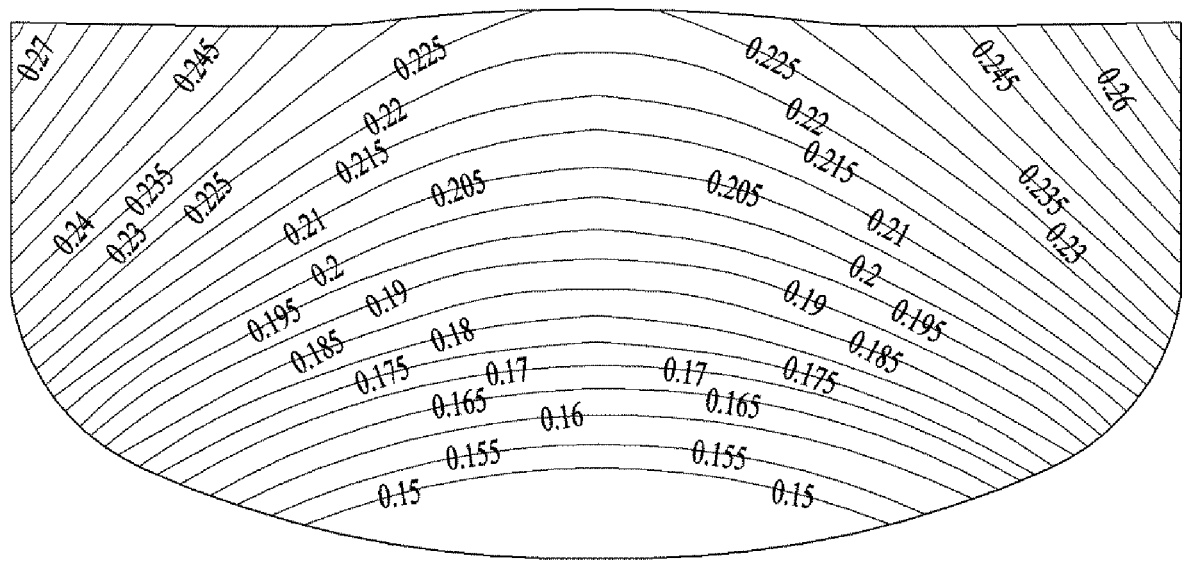
FIG. 5A illustrates a horizontal magnetic field that is applied to the melt in the first direction when the MGP is located at a position corresponding to +150 mm.
Figure 5B:
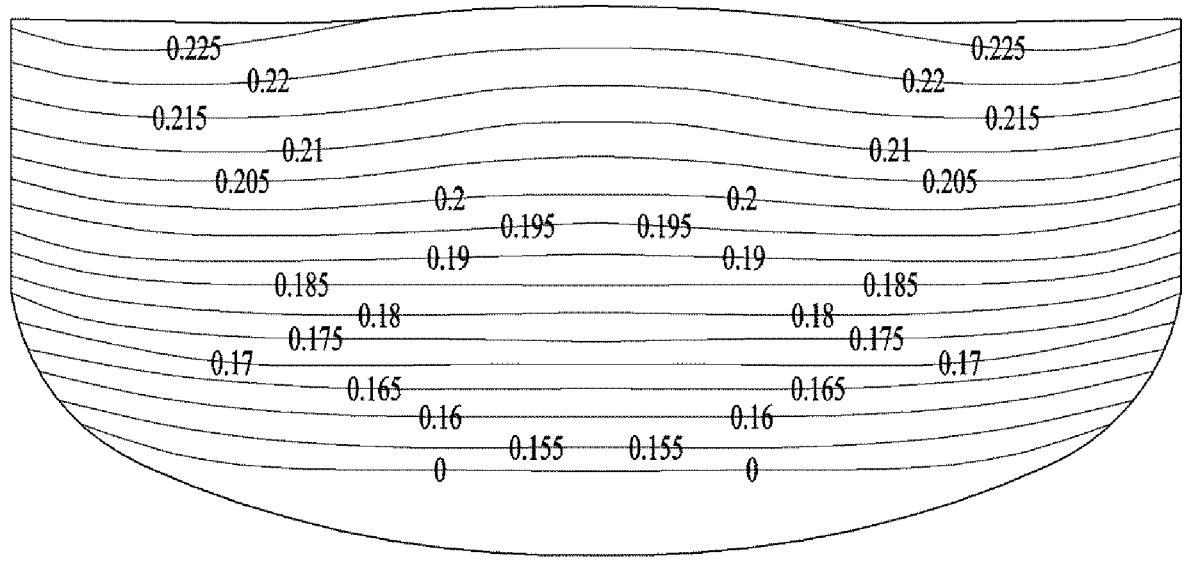
FIG. 5B illustrates a horizontal magnetic field that is applied to the melt in the second direction when the MGP is located at a position corresponding to +150 mm.
Figure 6:
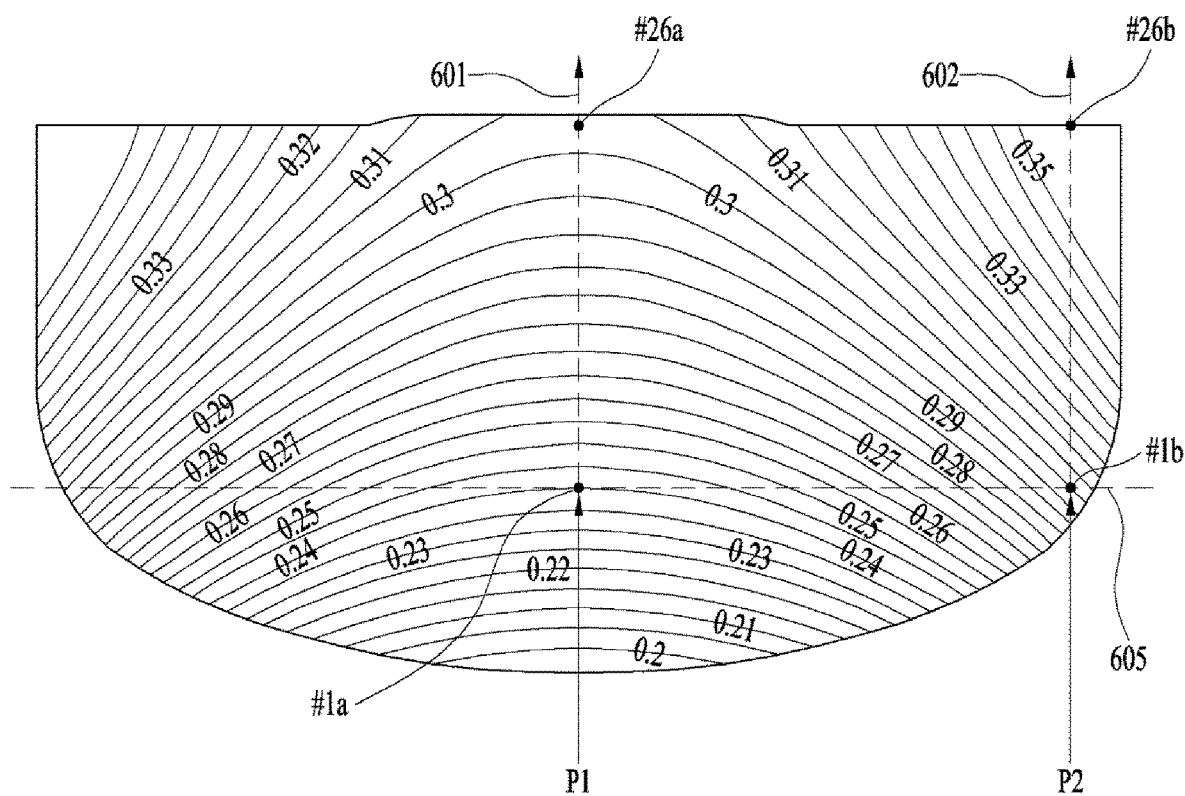
FIG. 6 illustrates analysis positions for measuring a difference in intensity of the magnetic field.

FIG. 3A illustrates the horizontal magnetic field that is applied to the melt in a first direction when the MGP is located at a position corresponding to +50 mm. FIG. 3B illustrates the horizontal magnetic field that is applied to the melt in a second direction when the MGP is located at a position corresponding to +50 mm. FIG. 4A illustrates the horizontal magnetic field that is applied to the melt in the first direction when the MGP is located at a position corresponding to +100 mm. FIG. 4B illustrates the horizontal magnetic field that is applied to the melt in the second direction when the MGP is located at a position corresponding to +100 mm. FIG. 5A illustrates the horizontal magnetic field that is applied to the melt in the first direction when the MGP is located at a position corresponding to +150 mm. FIG. 5B illustrates the horizontal magnetic field that is applied to the melt in the second direction when the MGP is located at a position corresponding to +150 mm. FIG. 6 illustrates positions at which the intensities of the magnetic field are measured to analyze the variation thereof.

For example, a magnetic field generating source of the magnetic field generating unit 80 may be located in a first horizontal direction. For example, the N-pole and the S-pole of the source of the magnetic field generating unit 80 for generating a magnetic field may be disposed so as to face each other in the first horizontal direction.

The lines shown in FIGS. 3A to 6 represent isodynamic lines, and the numbers on the isodynamic lines represent the intensities of the magnetic field. The unit of intensity of the magnetic field may be Tesla.

On the assumption that the direction in which the single-crystal ingot is pulled up is a Z-axis direction, the first direction may be an X-axis direction, and the second direction may be a Y-axis direction.

Referring to FIG. 6, when the MGP is located at a position corresponding to a predetermined positive (+) distance, the difference between the intensity of the magnetic field at the center point P1 of the melt 20 within the crucible 10 and the intensity of the magnetic field at the edge point P2 of the melt 20 within the crucible 10 may be measured.

For example, the difference in intensity of the magnetic field between the center point P1 of the melt and the edge point P2 of the melt may be a value that is obtained by subtracting the intensity of the magnetic field at the center point P1 of the melt 20 from the intensity of the magnetic field at the edge point P2 of the melt 20.

For example, the center point P1 of the melt 20 may a certain point in the melt that lies on a center line 601 of the crucible 10, and the edge point P2 of the melt 20 may be a certain point in the melt that lies on a vertical line 602.

The center line 601 may be an imaginary line that passes through the center of the crucible 10 (or the center of the melt) and is perpendicular to the bottom surface of the crucible 10. The vertical line 602 may be a line that is parallel to the center line 601 and is spaced apart from the center line 601 by a predetermined distance so as to be close to the inner surface of the crucible 10.

The center point P1 and the edge point P2 may correspond to each other such that the center point P1 and the edge point P2 are located at the same height on the basis of the center of the bottom surface of the crucible 10.

For example, the center point P1 may include first positions or first points #1a to #26a, which are spaced apart from each other by a predetermined distance from the bottom of the center of the melt 20 to the top of the center of the melt 20 in the vertical direction.

Further, for example, the edge point P2 may include second positions or second points #1b to #26b, which are spaced apart from each other by a predetermined distance from the bottom of the edge of the melt 20 to the top of the edge of the melt 20 in the vertical direction.

Each of the predetermined distance between the first points #1a to #26a and the predetermined distance between the second points #1b to #26b may range from 5 mm to 15 mm. However, the disclosure is not limited thereto. For example, the predetermined distance may be 10 mm.

Each of the first points #1a to #26a may be located at the same height as a corresponding one of the second points #1b to #26b on the basis of the center of the bottom surface of the crucible 10, e.g. the quartz crucible 12.

For example, of the second points #1b to #26b, the lowermost point #1b may be a point that lies on a horizontal line 605. The horizontal line 605 may be a line that is perpendicular to the center line 601 and passes through the points at which the vertical inner side surfaces of the crucible and the curved bottom surface of the crucible 10 meet. However, the disclosure is not limited thereto.

The difference in intensity of the magnetic field between each of the first points #1a to #26a of the melt 20 and a corresponding one of the second points #1b to #26b of the melt 20 may be measured.

Figure 7:
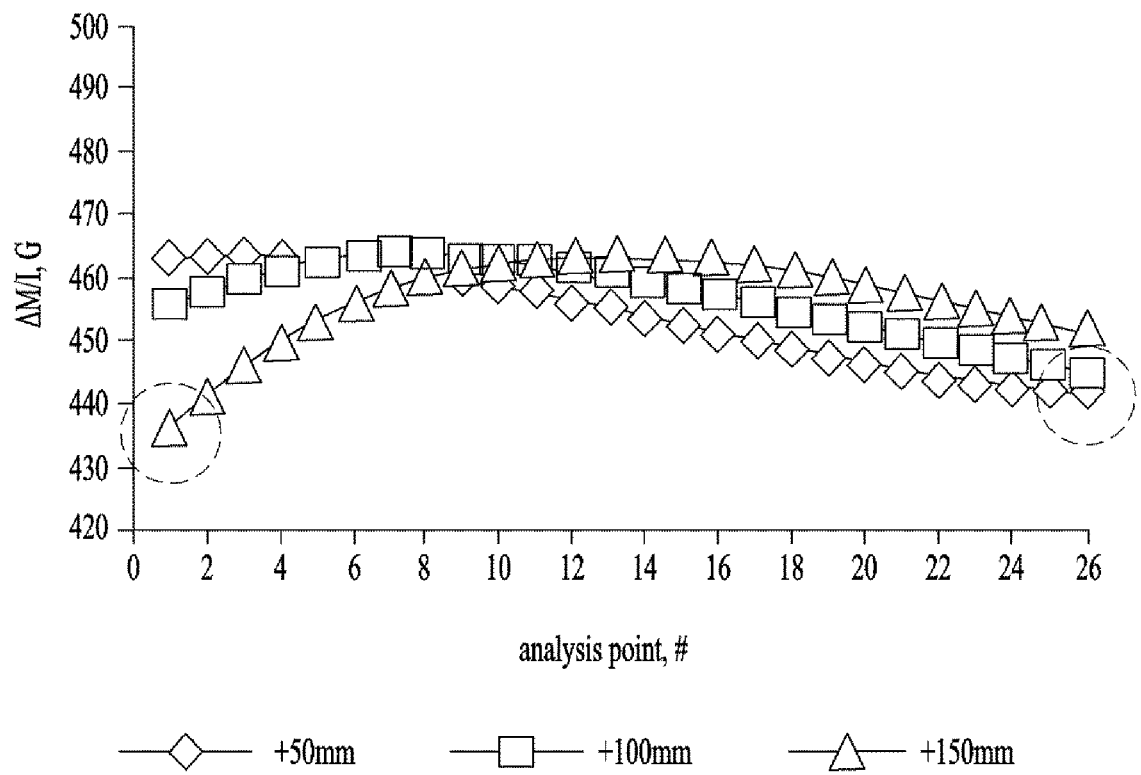
FIG. 7 illustrates a difference in intensity of the magnetic field between a center point of the melt and an edge point of the melt in each of FIGS. 3A, 4A and 5A.

FIG. 7 illustrates the difference ΔMI in intensity of the magnetic field between the center point P1 of the melt 20 and the edge point P2 of the melt 20 in each of FIGS. 3A, 4A and 5A.

Referring to FIG. 7, when the MGP is located at a position corresponding to +50 mm, the difference in intensity of the magnetic field between the center point P1 of the melt 20 and the edge point P2 of the melt 20 in FIG. 3A may range from about 463G to about 442G.

When the MGP is located at a position corresponding to +100 mm, the difference in intensity of the magnetic field between the two points P1 and P2 in FIG. 4A may range from about 464G to about 445G.

When the MGP is located at a position corresponding to +150 mm, the difference in intensity of the magnetic field between the two points P1 and P2 in FIG. 5A may range from about 435G to about 463G.

In the embodiment, the lower limit of the location of the MGP may be set to a position corresponding to +50 mm, and the upper limit of the location of the MGP may be set to a position corresponding to +150 mm.

The magnetic field generating unit 80 may be moved in the vertical direction, which is parallel to the direction in which the single-crystal ingot 30 is pulled up, so as to adjust the location of the MGP. However, due to structural restriction, the magnetic field generating unit 80 may not be controlled to move such that the MGP is located at a position exceeding +150 mm.

Further, the magnetic field generating unit 80 may not be controlled to move such that the MGP is located at a position below +50 mm because the convection of the melt becomes highly unstable, and this instability has a negative influence on the growth of the single-crystal ingot.

Figure 8:
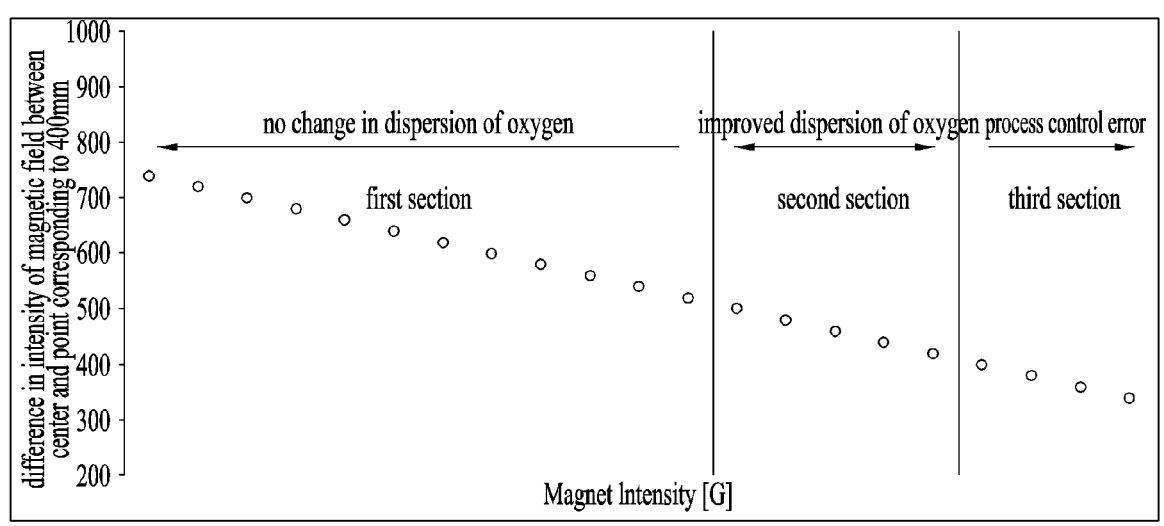
FIG. 8 illustrates a difference in intensity of the magnetic field between the center point of the melt and the edge point of the melt when the MGP is located at a position corresponding to +100 mm.
Figure 9A:
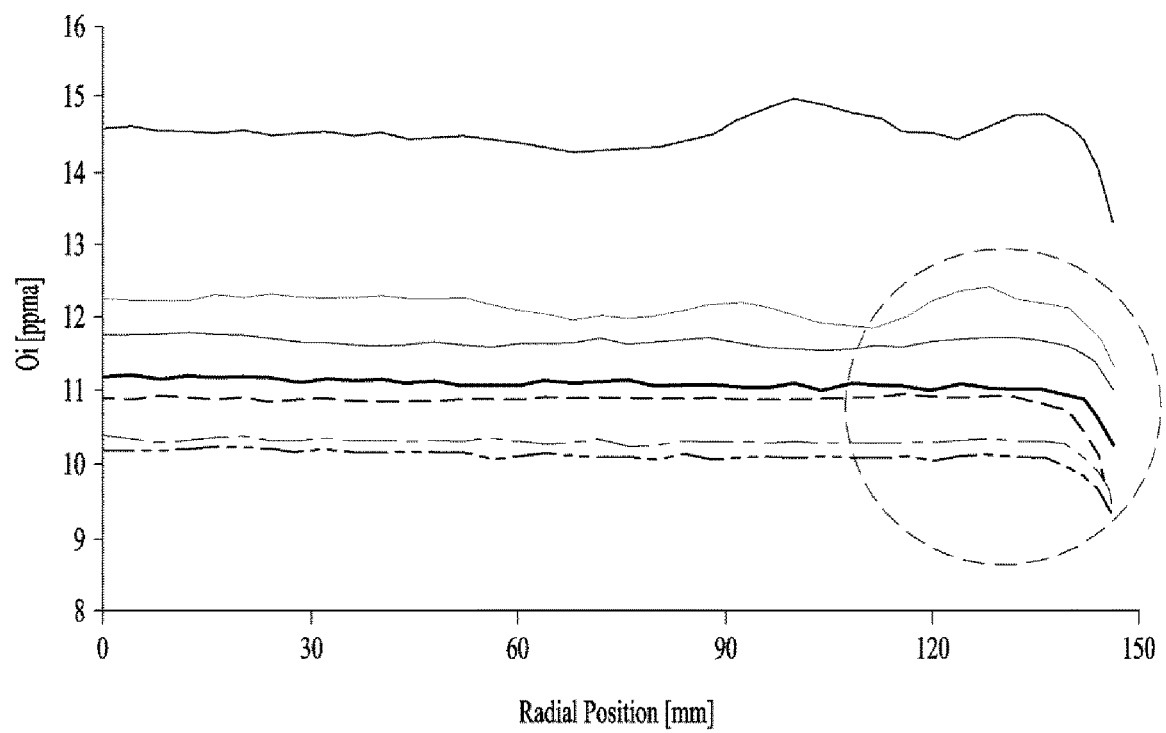
FIG. 9A illustrates an oxygen concentration in the radial direction of sample wafers when the difference in intensity of the magnetic field shown in FIG. 8 falls within a first section.

FIG. 8 illustrates the difference in intensity of the magnetic field between the center point P1 of the melt 20 and the edge point P2 of the melt 20 when the MGP is located at a position corresponding to +100 mm. FIG. 9A illustrates the oxygen concentration Oi in the radial direction of sample wafers when the difference in intensity of the magnetic field shown in FIG. 8 falls within a first section. The difference in intensity of the magnetic field shown in FIG. 8 may be a value that is obtained by subtracting the intensity of the magnetic field at the center point P1 of the melt 20 from the intensity of the magnetic field at the edge point P2 of the melt 20. The edge point P2 may be located at a position spaced apart from the center point P1 by 400 mm.

For example, in FIG. 9A, the edge point P2 of the melt 20 may be a point that is spaced apart from the center point P1 of the melt 20 by a distance of about 400 mm in the radial direction within the crucible 10. However, the disclosure is not limited thereto. The location of the edge point P2 may vary depending on the size of the crucible 10.

The first section may be a section within which the difference in intensity of the magnetic field exceeds 500G. The oxygen concentration Oi may be an oxygen concentration between the lattices in a wafer manufactured using the single-crystal ingot 30.

The oxygen concentration shown in FIG. 9A may be an oxygen concentration in the radial direction of each of seven sample wafers obtained from the body of the single-crystal ingot 30 formed according to the embodiment. The diameter of the body of the single-crystal ingot may be 300 mm.

Each of the seven graphs in FIG. 9A represents the dispersion of the oxygen concentration in the radial direction from the center point of each of the seven sample wafers to the edge point thereof.

As shown in FIG. 9A, when the MGP is located at a position corresponding to +100 mm and the difference in intensity of the magnetic field between the center point P1 of the melt and the edge point P2 of the melt exceeds 500G, the oxygen concentration Oi may be inferior at the edges of the sample wafers. That is, as shown in FIG. 9A, when the difference in intensity of the magnetic field is within the first section, the oxygen concentration at the edges (the portion indicated by the dotted line in FIG. 9A) of the sample wafers drops sharply, and thus the dispersion of the oxygen concentration in the radial direction of the sample wafers is not improved.

For example, when the difference in intensity of the magnetic field between the center point of the melt and the edge point of the melt is within the first section, the mean value of the differences between the maximum values of the oxygen concentration and the minimum values of the oxygen concentration at the edges of the sample wafers obtained from a single-crystal ingot having a diameter of 300 mm may be 0.531 ppma.

For example, the edge point of the sample wafer may be a point between the first point (e.g. 132 mm) and the second point (e.g. 144 mm), which are spaced apart from the center of the sample wafer in the radial direction.

Figure 9B:
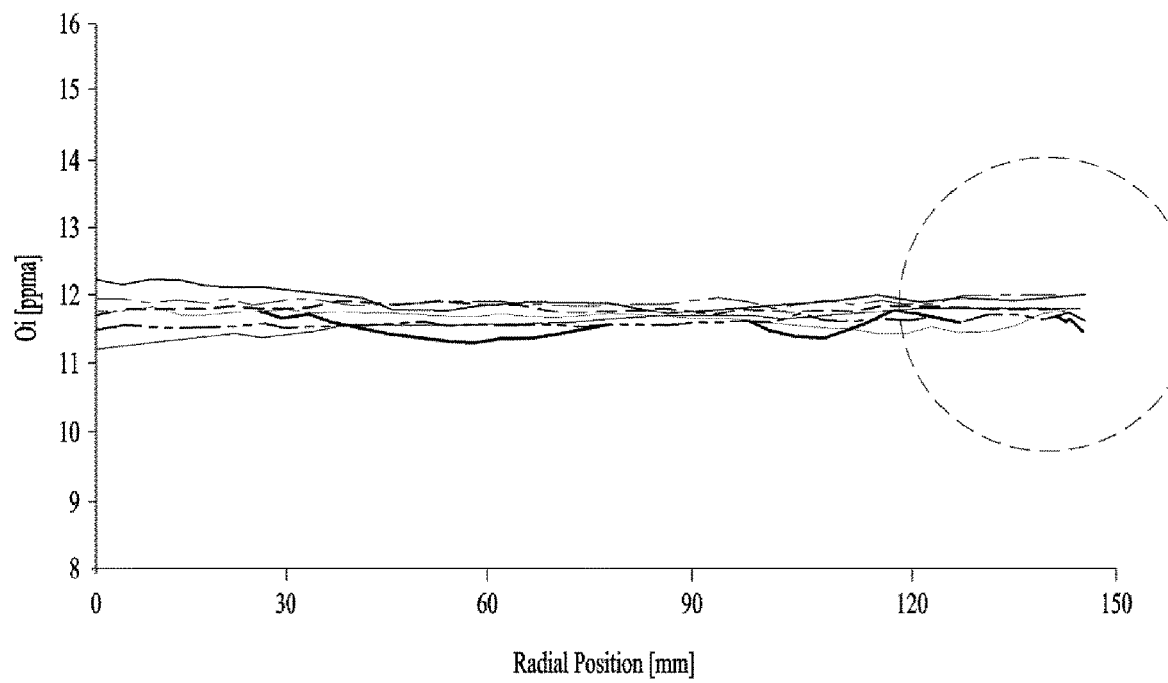
FIG. 9B illustrates an oxygen concentration in the radial direction of sample wafers when the difference in intensity of the magnetic field shown in FIG. 8 falls within a second section.

FIG. 9B illustrates the oxygen concentration Oi in the radial direction of sample wafers when the difference in intensity of the magnetic field shown in FIG. 8 falls within a second section. The second section may be a section within which the difference in intensity of the magnetic field ranges from 420G to 500G. The difference in intensity of the magnetic field shown in FIG. 9B merely has a different value from the difference in intensity of the magnetic field shown in FIG. 9A, but the method of obtaining the sample wafers shown in FIG. 9B may be the same as the method of obtaining the sample wafers shown in FIG. 9A.

Referring to FIG. 9B, when the MGP is located at a position corresponding to +100 mm and the difference in intensity of the magnetic field between the center point P1 of the melt and the edge point P2 of the melt ranges from 420G to 500G, inferiority of the oxygen concentration Oi at the edges (the portion indicated by the dotted line in FIG. 9B) of the sample wafers may be suppressed, and thus the dispersion of the oxygen concentration in the radial direction of the sample wafers may be improved.

For example, as shown in FIG. 9B, when the difference in intensity of the magnetic field is within the second section, the difference between the maximum value of the oxygen concentration and the minimum value of the oxygen concentration at the edge of each of the seven sample wafers obtained from a single-crystal ingot having a diameter of 300 mm may be 0.15 ppma.

The difference between the maximum value of the oxygen concentration and the minimum value of the oxygen concentration at the edge of each of the sample wafers in FIG. 9B may be less than the difference between the maximum value of the oxygen concentration and the minimum value of the oxygen concentration at the edge of each of the sample wafers in FIG. 9A.

As can seen from FIG. 9B, in order to realize dispersion of the oxygen concentration such that the difference between the maximum value of the oxygen concentration and the minimum value of the oxygen concentration at the edge of the sample wafer is less than 0.15 ppma, when the MGP is located at a position corresponding to +100 mm, the difference in intensity of the magnetic field between the center point of the melt and the edge point of the melt may be set to be in the range from 420G to 500G.

As described above with reference to FIG. 9B, when the MGP is located at a position corresponding to +100 mm during the body-growing process, the difference in intensity of the magnetic field between the center point P1 of the melt and the edge point P2 of the melt is set to be in the range from 420G to 500G. Thereby, according to the embodiment, it is possible to realize dispersion of the oxygen concentration such that the difference between the maximum value of the oxygen concentration and the minimum value of the oxygen concentration at the edge of the sample wafer is less than 0.15 ppma.

Figure 9C:
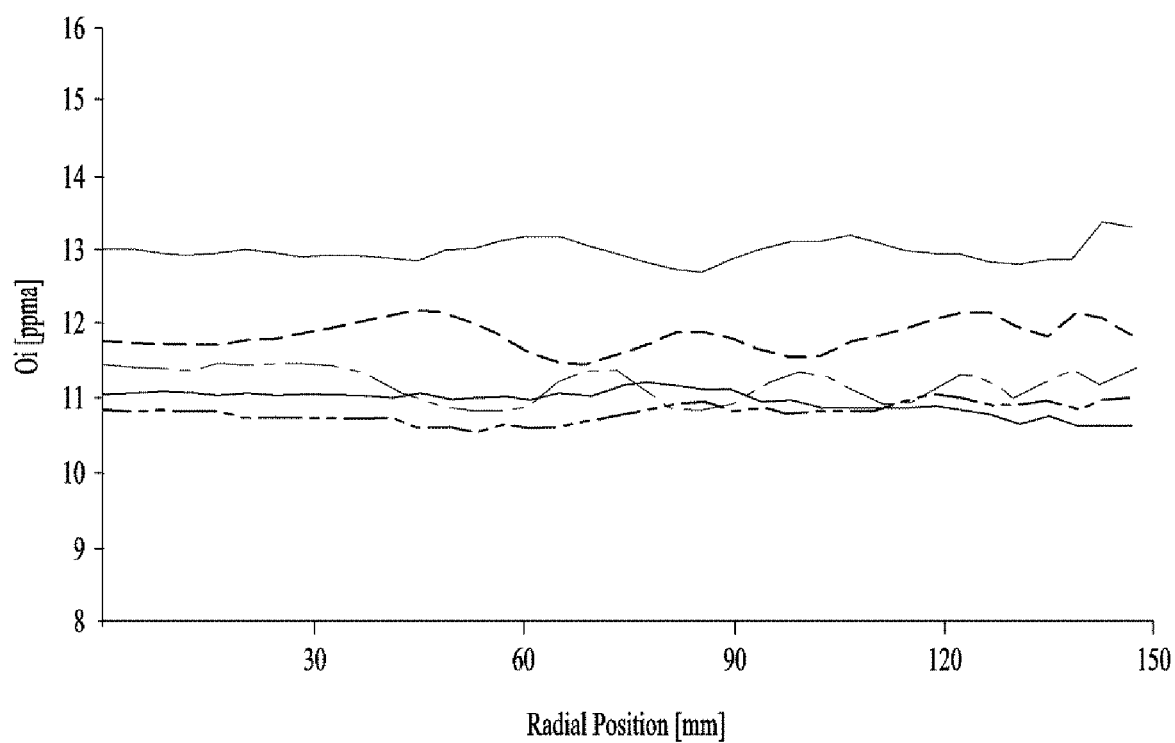
FIG. 9C illustrates an oxygen concentration in the radial direction of sample wafers when the difference in intensity of the magnetic field shown in FIG. 8 falls within a third section.

FIG. 9C illustrates the oxygen concentration Oi in the radial direction of sample wafers when the difference in intensity of the magnetic field shown in FIG. 8 falls within a third section. The third section may be a section within which the difference in intensity of the magnetic field is less than 420G.

Referring to FIG. 9C, the oxygen concentration at the edge of each of the sample wafers may not drop, but a long periodic pattern, i.e. irregular dispersion of the oxygen concentration, may occur in the region from the center of each of the sample wafers to the edge thereof, leading to deterioration of the quality of the sample wafers. Moreover, in the third section, it may be difficult to control the pulling speed of the single-crystal ingot during the body-growing process.

According to the embodiment, it may be possible to control the degree of freedom of the melt and to reduce variation in the magnetic flux density in the radial direction of the melt by setting the difference in intensity of the magnetic field between the edge point of the melt and the center point of the melt so as to fall within the second section.

Subsequently, the intensity of the magnetic field that is to be applied to the melt may be set based on the set difference (i.e. 420G to 500G) in intensity of the magnetic field (S130).

In other words, the intensity of the magnetic field that is to be applied to the melt may be set so that the difference in intensity of the magnetic field has the set value (i.e. 420G to 500G).

Figure 10A:
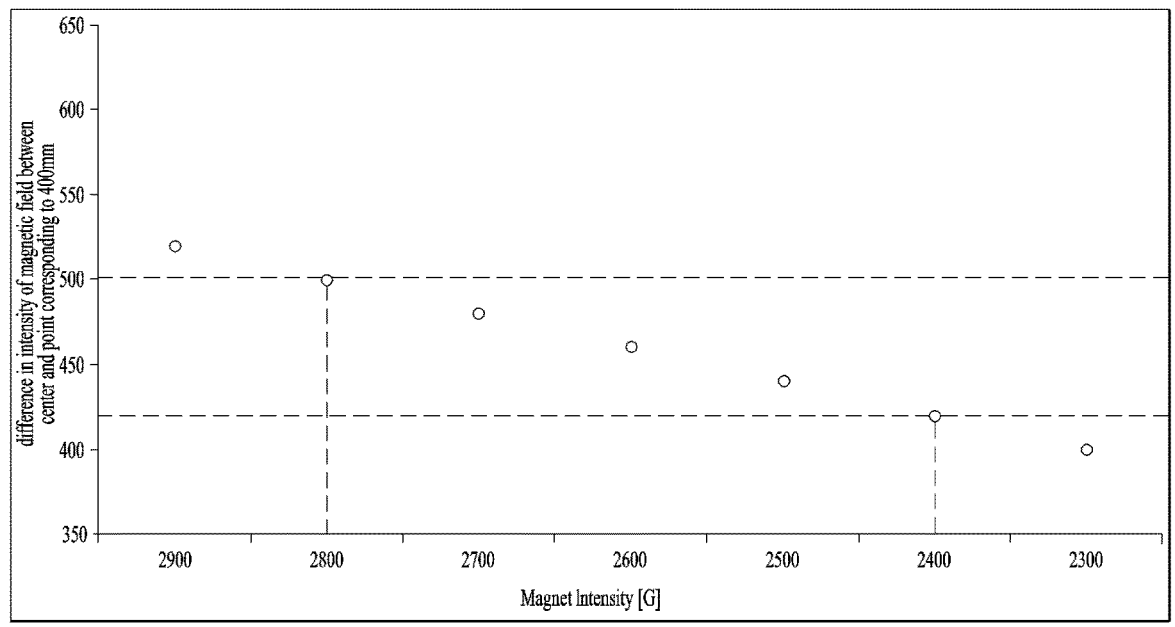
FIG. 10A illustrates an intensity of the magnetic field that is applied to the melt in accordance with the difference in intensity of the magnetic field between the center point of the melt and the edge point of the melt when the MGP is located at a position corresponding to +100 mm.

FIG. 10A illustrates the intensity of the magnetic field that is applied to the melt in accordance with the difference in intensity of the magnetic field between the center point of the melt and the edge point of the melt when the MGP is located at a position corresponding to +100 mm.

In FIG. 10A, the X axis may represent the intensity of the horizontal magnetic field that is applied to the melt or the intensity of the horizontal magnetic field generated by the magnetic field generating unit 80. In FIG. 10A, the edge point P2 of the melt may be a point that is spaced apart from the center point of the melt by a distance of 400 mm in the radial direction.

Referring to FIG. 10A, when the MGP is located at a position corresponding to +100 mm and the intensity of the magnetic field applied to the melt ranges from 2400G to 2800G, the difference in intensity of the magnetic field between the center point P1 of the melt 20 and the edge point P2 of the melt 20 may range from 420G to 500G.

Depending on the diameter of the melt within the crucible or the location of the edge point thereof, the range of intensity of the magnetic field that is applied to the melt, which allows the difference in intensity of the magnetic field between the center point P1 of the melt 20 and the edge point P2 of the melt 20 to fall within the range from 420G to 500G, may vary.

When the MGP is located at a position corresponding to +100 mm, during the body-growing process, the intensity of the magnetic field that is applied to the melt may be adjusted so that the difference in intensity of the magnetic field between the center point P1 of the melt and the edge point P2 of the melt falls within the range from 420G to 500G. Thereby, the embodiment may enable stable process control and may improve the dispersion of the oxygen concentration so that the oxygen concentration may be uniform in the radial direction of the wafer. For example, in the embodiment, the difference between the maximum value of the oxygen concentration and the minimum value of the oxygen concentration at the edge of the wafer may be set to be less than 0.15 ppma.

Figure 10B:
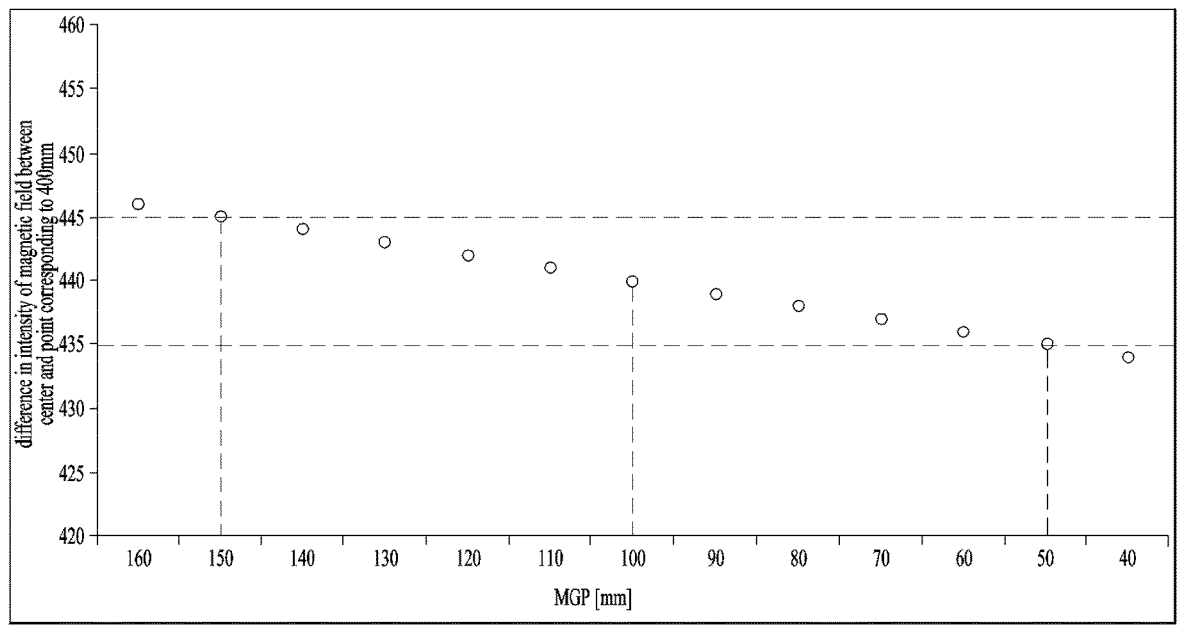
FIG. 10B is a graph showing the relationship between the location of the MGP and the difference in intensity of the magnetic field.

FIG. 10B is a graph showing the relationship between the location of the MGP and the difference in intensity of the magnetic field.

Referring to FIG. 10B, even when the intensity of the magnetic field applied to the melt is uniform, the difference in intensity of the magnetic field between the center point of the melt and the edge point of the melt may vary depending on the location of the MGP.

For example, under the condition that the intensity of the magnetic field that is applied to the melt is uniform, when the MGP is moved to a position corresponding to +50 mm, +100 mm or +150 mm, the difference in intensity of the magnetic field between the center point of the melt and the edge point of the melt may be 435G, 440G or 445G.

In order to realize desired dispersion of the oxygen concentration in the radial direction of the wafer, the MGP needs to be within a predetermined positional range, and the difference in intensity of the magnetic field between the center point of the melt and the edge point of the melt needs to fall within the range from 420G to 500G.

In order to set the difference in intensity of the magnetic field to fall within the range from 420G to 500G, the intensity of the magnetic field that is applied to the melt may vary depending on the location of the MGP.

Figure 11:
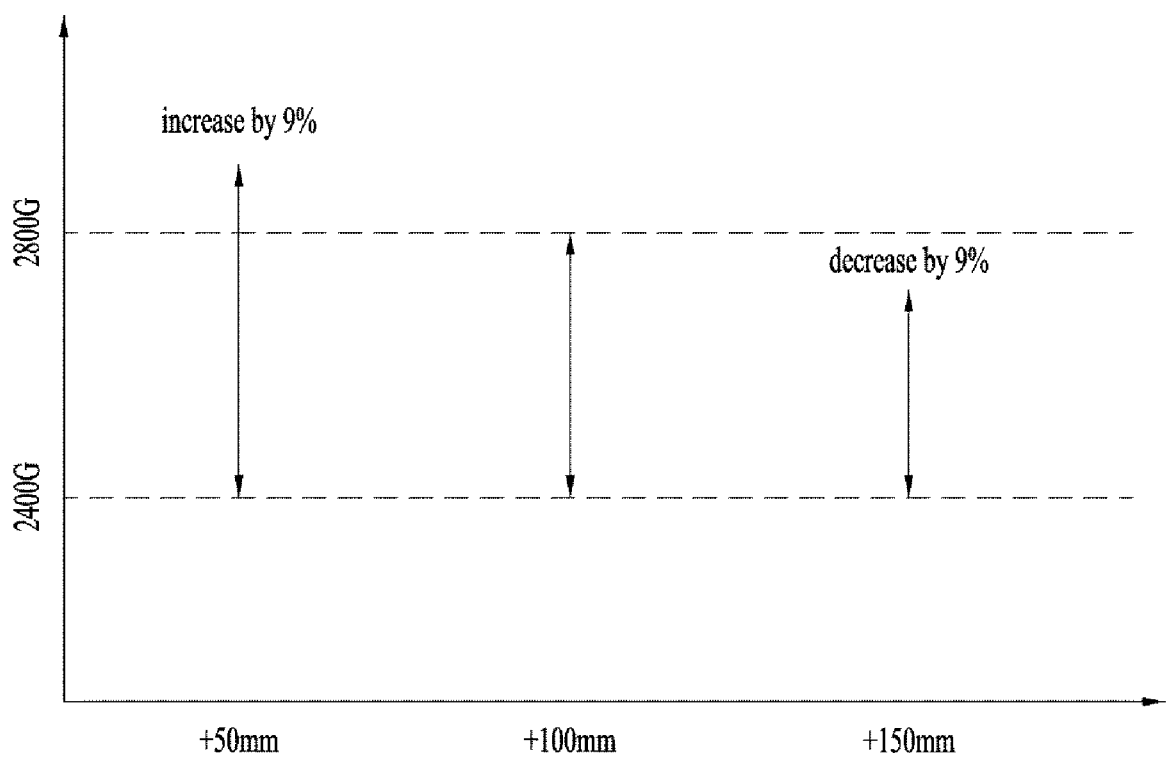
FIG. 11 illustrates variation in the maximum value of the intensity of the magnetic field that is applied to the melt in order to set the difference in intensity of the magnetic field to fall within the second section in accordance with the location of the MGP.
Figure 12:
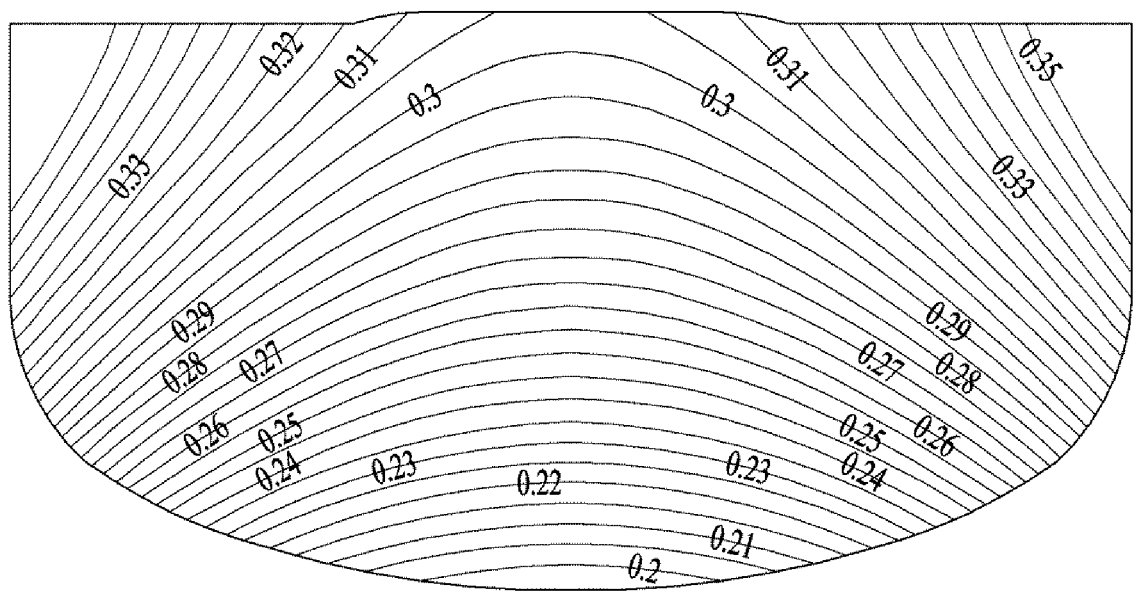
FIG. 12 illustrates a horizontal magnetic field that is generally applied to a melt in a crucible.
Figure 13:
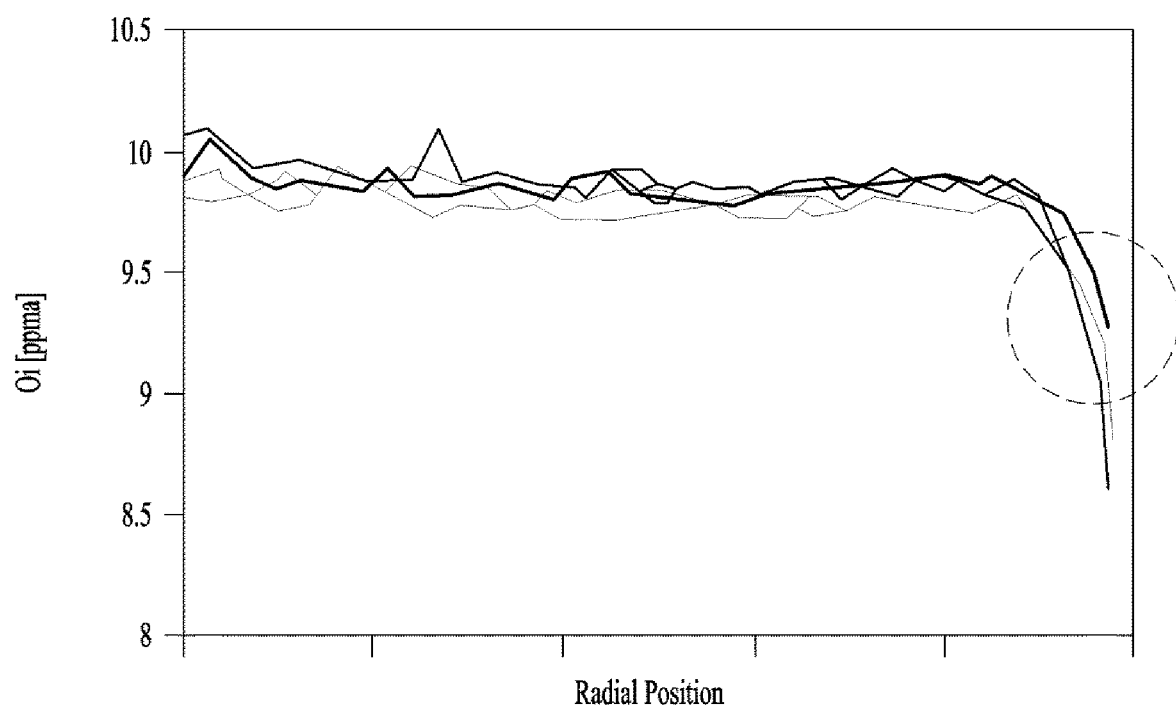
FIG. 13 illustrates an oxygen concentration in the radial direction of a single-crystal ingot that is grown in the state in which the horizontal magnetic field shown in FIG. 12 is applied thereto.

FIG. 11 illustrates variation in the maximum value of the intensity of the magnetic field that is applied to the melt in order to set the difference in intensity of the magnetic field to fall within the second section in accordance with the location of the MGP.

Based on the maximum value (hereinafter, referred to as a 'reference maximum value') of the intensity of the horizontal magnetic field that is applied to the melt when the MGP is located at a position corresponding to +100 mm (refer to FIG. 10A), the maximum values of the intensity of the horizontal magnetic field corresponding to other locations (e.g. +50 mm and +150 mm) of the MGP may be experimentally obtained.

Referring to FIG. 11, when the location of the MGP is moved down from the position corresponding to +100 mm to the position corresponding to +50 mm, in order to set the difference in intensity of the magnetic field to fall within the second section, the maximum value of the intensity of the horizontal magnetic field that is applied to the melt may be increased by 9% in comparison with the reference maximum value.

Here, the reference maximum value may be the maximum value (e.g. 2800G) of the intensity of the horizontal magnetic field that is applied to the melt in order to set the difference in intensity of the magnetic field to fall within the second section when the MGP is located at a position corresponding to +100 mm.

When the location of the MGP is moved up from the position corresponding to +100 mm to the position corresponding to +150 mm, in order to set the difference in intensity of the magnetic field to fall within the second section, the maximum value of the intensity of the horizontal magnetic field that is applied to the melt may be decreased by 9% in comparison with the reference maximum value.

On the other hand, in the case in which the minimum value of the intensity of the horizontal magnetic field that is applied to the melt in order to set the difference in intensity of the magnetic field to fall within the second section may be set to 2400G or less, the difference in intensity of the magnetic field may not be substantially changed regardless of the location of the MGP, and thus the convection of the melt becomes more unstable.

According to the experimental results, when the location of the MGP is within the range from +50 mm to +150 mm, the maximum value of the intensity of the magnetic field at which the difference in intensity of the magnetic field falls within the second section may vary at a constant rate in accordance with a change in the location of the MGP.

For example, when the location of the MGP is within the range from +50 mm to +150 mm, the intensity of the horizontal magnetic field that the magnetic field generating unit 80 generates in accordance with the location of the MGP may be determined by Equation 1 based on experimental results.

$$420 < 0.175 \times (X-2400) + 0.1 \times (Y-50) + 422.5 < 500 \qquad \text{[Equation 1]}$$

Here, X may be the intensity of the magnetic field generated by the magnetic field generating unit 80 or the intensity of the horizontal magnetic field applied to the melt, and Y may be the location of the MGP. For example, the ranges of X and Y may be as follows: $X \geq 2400G$ and $Y \geq 50$ mm.

For example, when the MGP is located at a position corresponding to +100 mm, Equation 1 may be expressed as follows: $2400G \leq X < 2814.3G$. In Equation 1, the value on the right of the inequality sign may be a value rounded off to one decimal place.

For example, when the MGP is located at a position corresponding to +70 mm, Equation 1 may be expressed as follows: $2400G \leq X < 2828.6G$.

For example, when the MGP is located at a position corresponding to +120 mm, Equation 1 may be expressed as follows: $2400G \leq X < 2802.9G$.

It can be seen that the maximum value of X in accordance with the location of the MGP is determined by Equation 1.

Subsequently, a single-crystal ingot is grown on the basis of the set location of the MGP and the set intensity of the magnetic field (S140).

The set location of the MGP and the set intensity of the magnetic field may be maintained constant during the body-growing process of the single-crystal ingot.

Alternatively, the set location of the MGP and the set intensity of the magnetic field may be maintained constant during the necking process, the shouldering process, the body-growing process and the tailing process of the single-crystal ingot.

Furthermore, as described above with reference to FIG. 11, the maximum value of the intensity of the magnetic field at which the difference in intensity of the magnetic field falls within the second section may vary at a constant rate in accordance with a change in the location of the MGP.

The single-crystal ingot growing method according to the embodiment may further include steps of changing the set location of the MGP and adjusting the intensity of the magnetic field that is applied to the melt so that the difference in intensity of the magnetic field falls within the range from 420G to 500G in accordance with the changed location of the MGP.

For example, the intensity of the horizontal magnetic field in accordance with the change in the location of the MGP may be adjusted based on the changed location of the MGP and Equation 1. By growing a single-crystal ingot, e.g. a body, under the conditions described above with reference to Equation 1, the embodiment is capable of preventing a phenomenon in which an oxygen concentration drops at the edge (for example, a region spaced apart from the center of a wafer by a distance ranging from 132 mm to 144 mm) of a wafer manufactured using the single-crystal ingot grown under the above-described conditions, and is capable of growing a single-crystal ingot to obtain a wafer in which the dispersion of oxygen concentration is uniform in the radial direction of the wafer. In more detail, according to the embodiment, the difference between the maximum value of the oxygen concentration and the minimum value of the oxygen concentration at the edge of the wafer manufactured using the single-crystal ingot grown under the conditions described above with reference to Equation 1 may be less than 0.15 ppma.

As is apparent from the above description, embodiments may improve the dispersion of oxygen concentration in the radial direction of a single-crystal ingot or a wafer manufactured using the same.

The features, structures and effects and the like described in association with the embodiments above are incorporated into at least one embodiment of the present invention, but are not limited only to the one embodiment. Furthermore, the features, structures and effects and the like exemplified in association with respective embodiments can be implemented in other embodiments by combination or modification by those skilled in the art. Therefore, content related to such combinations and modifications should be construed as falling within the scope of the present invention.

What is claimed is:

1. A single-crystal ingot growing method comprising:
setting a location of an MGP (maximum gauss position) of a magnetic field such that the MGP is located above a surface of a melt;
setting a difference in intensity of the magnetic field between a center point of the melt and an edge point of the melt based on the set location of the MGP;
setting an intensity of the magnetic field that is applied to the melt based on the set difference in intensity of the magnetic field; and
growing a single-crystal ingot based on the set location of the MGP and the set intensity of the magnetic field,
wherein, in order to set a difference between a maximum value of an oxygen concentration and a minimum value of the oxygen concentration at an edge of a wafer manufactured using the grown single-crystal ingot to be less than 0.15 ppma, the magnetic field is a horizontal magnetic field, the MGP is located so as to be spaced apart from the surface of the melt by a distance ranging from +50 mm to +150 mm, and the difference in intensity of the magnetic field ranges from 420G to 500G.

2. The method according to claim 1, wherein the set location of the MGP and the set intensity of the magnetic field are maintained constant during a body-growing process of the single-crystal ingot.

3. The method according to claim 1, wherein the surface of the melt is a top surface of the melt that is located between an inner surface of a crucible containing the melt therein and an interface between the single-crystal ingot and the melt.

4. The method according to claim 3, wherein the center point of the melt and the edge point of the melt correspond to each other, and
wherein the center point and the edge point that correspond to each other are located at a same height based on a center of a bottom surface of the crucible.

5. The method according to claim 1, wherein the difference in intensity of the magnetic field is a value that is obtained by subtracting an intensity of the magnetic field at the center point of the melt from an intensity of the magnetic field at the edge point of the melt.

6. The method according to claim 1, further comprising:
changing the set location of the MGP; and
adjusting the intensity of the magnetic field that is applied to the melt so that the difference in intensity of the magnetic field falls within a range from 420G to 500G in accordance with the changed location of the MGP.

7. The method according to claim 1, wherein the set location of the MGP and the set intensity of the magnetic field are maintained constant during a necking process, a shouldering process, a body-growing process and a tailing process of the single-crystal ingot.

8. A single-crystal ingot growing method comprising:
setting a location of an MGP (maximum gauss position) of a magnetic field such that the MGP is located so as to be spaced apart from a surface of a melt by a distance ranging from +50 mm to +150 mm;
setting an intensity of the magnetic field that is applied to the melt such that a difference in intensity of the magnetic field between a center point of the melt and an edge point of the melt ranges from 420G to 500G under a condition of the set location of the MGP; and
growing a single-crystal ingot based on the set location of the MGP and the set intensity of the magnetic field,
wherein, in order to set a difference between a maximum value of an oxygen concentration and a minimum value of the oxygen concentration at an edge of a wafer manufactured using the grown single-crystal ingot to be less than 0.15 ppma, the magnetic field is a horizontal magnetic field, and the intensity of the magnetic field is set by following Equation 1:

$$420 < 0.175 \times (X-2400) + 0.1 \times (Y-50) + 422.5 < 500 \quad \text{[Equation 1]}$$

where, X is the intensity of the magnetic field and Y is the location of the MGP, ranges of X and Y being as follows: X≥2400G and Y≥50 mm.

9. The method according to claim 8, wherein the set location of the MGP and the set intensity of the magnetic field are maintained constant during a body-growing process of the single-crystal ingot.

10. The method according to claim 8, wherein the surface of the melt is a top surface of the melt that is located between an inner surface of a crucible containing the melt therein and an interface between the single-crystal ingot and the melt.

11. The method according to claim 10, wherein the center point of the melt and the edge point of the melt correspond to each other, and wherein the center point and the edge point that correspond to each other are located at a same height based on a center of a bottom surface of the crucible.

12. The method according to claim 8, wherein the difference in intensity of the magnetic field is a value that is obtained by subtracting an intensity of the magnetic field at the center point of the melt from an intensity of the magnetic field at the edge point of the melt.

13. The method according to claim 8, further comprising:
changing the set location of the MGP; and
adjusting the intensity of the magnetic field based on the changed location of the MGP and Equation 1.

14. The method according to claim 8, wherein the set location of the MGP and the set intensity of the magnetic field are maintained constant during a necking process, a shouldering process, a body-growing process and a tailing process of the single-crystal ingot.

15. A single-crystal ingot growing apparatus comprising:
a crucible for containing a melt therein;
a support rotation shaft for supporting and rotating the crucible;
a magnetic field generating unit for generating a magnetic field and applying the magnetic field to the melt contained in the crucible; and
a controller for controlling the magnetic field generating unit in order to adjust a location of an MGP (maximum gauss position) of the magnetic field and an intensity of the magnetic field,
wherein, in order to set a difference between a maximum value of an oxygen concentration and a minimum value of the oxygen concentration at an edge of a wafer manufactured using a single-crystal ingot to be less than 0.15 ppma, while the single-crystal ingot is grown, the controller controls the location of the MGP of the magnetic field such that the MGP is located so as to be spaced apart from a surface of the melt by a distance ranging from +50 mm to +150 mm, and controls the intensity of the magnetic field such that a difference in intensity of the magnetic field between a center point of the melt and an edge point of the melt ranges from 420G to 500G under a condition of the controlled location of the MGP.

16. The apparatus according to claim 15, wherein the magnetic field is a horizontal magnetic field, and
wherein the intensity of the magnetic field is set by following Equation 1:

$$420<0.175\times(X-2400)+0.1\times(Y-50)+422.5<500 \quad \text{[Equation 1]}$$

where, X is the intensity of the magnetic field and Y is the location of the MGP, ranges of X and Y being as follows: $X \geq 2400G$ and $Y \geq 50$ mm.

17. The apparatus according to claim 15, wherein the location of the MGP and the intensity of the magnetic field are maintained constant during a body-growing process of the single-crystal ingot.

18. The apparatus according to claim 15, wherein the surface of the melt is a top surface of the melt that is located between an inner surface of the crucible containing the melt therein and an interface between the single-crystal ingot and the melt.

19. The apparatus according to claim 15, wherein the difference in intensity of the magnetic field is a value that is obtained by subtracting an intensity of the magnetic field at the center point of the melt from an intensity of the magnetic field at the edge point of the melt.

20. The apparatus according to claim 16, wherein the controller changes the location of the MGP and adjusts the intensity of the magnetic field based on the changed location of the MGP and Equation 1.

* * * * *